United States Patent

Arai et al.

[11] Patent Number: 5,576,222
[45] Date of Patent: Nov. 19, 1996

[54] METHOD OF MAKING A SEMICONDUCTOR IMAGE SENSOR DEVICE

[75] Inventors: Michio Arai; Masaaki Ikeda; Kazushi Sugiura; Nobuo Furukawa, all of Tokyo; Mitsufumi Kodama, Kanagawa; Yukio Yamauchi, Kanagawa; Naoya Sakamoto, Kanagawa; Takeshi Fukada, Kanagawa; Masaaki Hiroki, Kanagawa; Ichirou Takayama, Kanagawa, all of Japan

[73] Assignees: TDK Corp., Tokyo; Semiconductor Energy Laboratory Co. Ltd., Kanagawa, both of Japan

[21] Appl. No.: 324,737

[22] Filed: Oct. 18, 1994

Related U.S. Application Data

[60] Continuation-in-part of Ser. No. 189,498, Jan. 31, 1994, Pat. No. 5,442,198, which is a division of Ser. No. 825,552, Jan. 27, 1992, Pat. No. 5,298,455.

[30] Foreign Application Priority Data

Oct. 19, 1993 [JP] Japan .................... 5-260859

[51] Int. Cl.$^6$ .................... H01L 27/14; H01L 27/01; H01L 21/336; H01L 21/71
[52] U.S. Cl. .................... 437/4; 437/47; 437/60; 437/101; 437/21; 437/41
[58] Field of Search .................... 437/2, 3, 4, 101, 437/21, 109, 47, 51, 54, 60, 918, 919, 40 TFT, 41 TFT, 937; 117/8

[56] References Cited

U.S. PATENT DOCUMENTS

| | | | |
|---|---|---|---|
| 4,062,034 | 12/1977 | Matsushita et al. | 257/65 |
| 4,176,372 | 11/1979 | Matsushita et al. | 257/636 |
| 4,363,828 | 12/1982 | Brodsky et al. | 437/238 |
| 4,693,759 | 9/1987 | Noguchi et al. | 437/24 |

(List continued on next page.)

FOREIGN PATENT DOCUMENTS

| | | |
|---|---|---|
| 0310702 | 4/1989 | European Pat. Off. . |
| 0383230 | 8/1990 | European Pat. Off. . |
| 0093663 | 5/1986 | Japan . |
| 1-61062 | 3/1989 | Japan .................... 437/937 |
| 4-245482 | 9/1992 | Japan . |
| 4-245443 | 9/1992 | Japan . |

OTHER PUBLICATIONS

Kurihara, "Completely Integrated Contact–Type Linear a–Si/a–SiC Heterojunction Image Sensor" published on Mar. 23, 1989, in 23'd meeting in 147'th Committee of Amorphous Material in Japan Science Promotion Association. [no translation].

Sze, VLSI Technology, Mc Graw–Hill, 1988, pp. 233–235.

Scheid et al., Japanese Journal of Applied Physics, vol. 29, No. 11, Nov. 1990, Tokyo JP, pp. L2105–L2107.

Katoh, IEEE Transactions On Electron Devices, vol. 35, No. 7, Jul. 1988, New York US pp. 923–928.

Nakanishi et al., Extended Abstracts, vol. 90, No. 1, May 1990, Princeton, NJ US pp. 489–490.

*Primary Examiner*—Mary Wilczewski
*Attorney, Agent, or Firm*—Martin Novack

[57] ABSTRACT

An image sensor (10) has a substrate (1), an active layer (3') having a source region and a drain region placed on said substrate (1), a gate insulation layer (4') placed on said active layer, and a gate electrode layer (5') on said gate insulation layer (4'). The active layer (3') is produced by the steps of producing amorphous silicon layer by using disilane gas ($Si_2H_6$) through Low Pressure CVD process, and annealing said layer at 500°–650° C. for 4–50 hours in nitrogen gas atmosphere. The gate insulation layer (4') is produced through oxidation of the surface of the active layer at high temperature around 900°–1100° C. The oxidation process at high temperature improves the anneal process and improves the active layer. Thus, an image sensor with uniform characteristics is obtained with improved producing yield rate.

7 Claims, 6 Drawing Sheets

U.S. PATENT DOCUMENTS

| | | | |
|---|---|---|---|
| 4,727,044 | 2/1988 | Yamazaki | 437/45 |
| 4,814,292 | 3/1989 | Sasaki et al. | 437/101 |
| 4,862,237 | 8/1989 | Morozumi | 257/72 |
| 4,901,133 | 2/1990 | Curran et al. | 257/637 |
| 4,992,846 | 2/1991 | Sakakibara et al. | 257/64 |
| 5,165,075 | 11/1992 | Hiroki et al. | 359/59 |
| 5,242,855 | 9/1993 | Oguro | 437/109 |
| 5,262,654 | 11/1993 | Yamazaki | 257/53 |
| 5,273,910 | 12/1993 | Tran | 437/3 |
| 5,298,455 | 3/1994 | Arai et al. | 437/109 |
| 5,371,039 | 12/1994 | Oguro | 437/101 |
| 5,372,958 | 12/1994 | Miyasaka et al. | 437/40 |

METHOD OF MAKING A SEMICONDUCTOR IMAGE SENSOR DEVICE

COPENDING APPLICATION

This is a continuation-in-part application based upon U.S. patent application Ser. No. 08/189,498 filed Jan. 31, 1994, now U.S. Pat. No. 5,442,198, which is a divisional of U.S. patent application Ser. No. 07/825,552, filed Jan. 27, 1992 (now U.S. Pat. No. 5,298,455).

BACKGROUND OF THE INVENTION

The present invention relates to a thin film transistor (TFT) having optical-electrical conversion function or an image sensor, and producing method of such a transistor. In particular, the present invention relates to such a transistor, or an image sensor, which is excellent in productivity or producing yield rate.

Conventionally, a photo-diode, and/or a photo-conductor type cell has been used as an optical-electrical converter or an image sensor in a facsimile device and/or a copy machine et al. In those devices, amorphous silicon, single crystal silicon, $C_dS$, $C_dS_e$, $C_dS-S_e$ have been used.

Figure 7A:
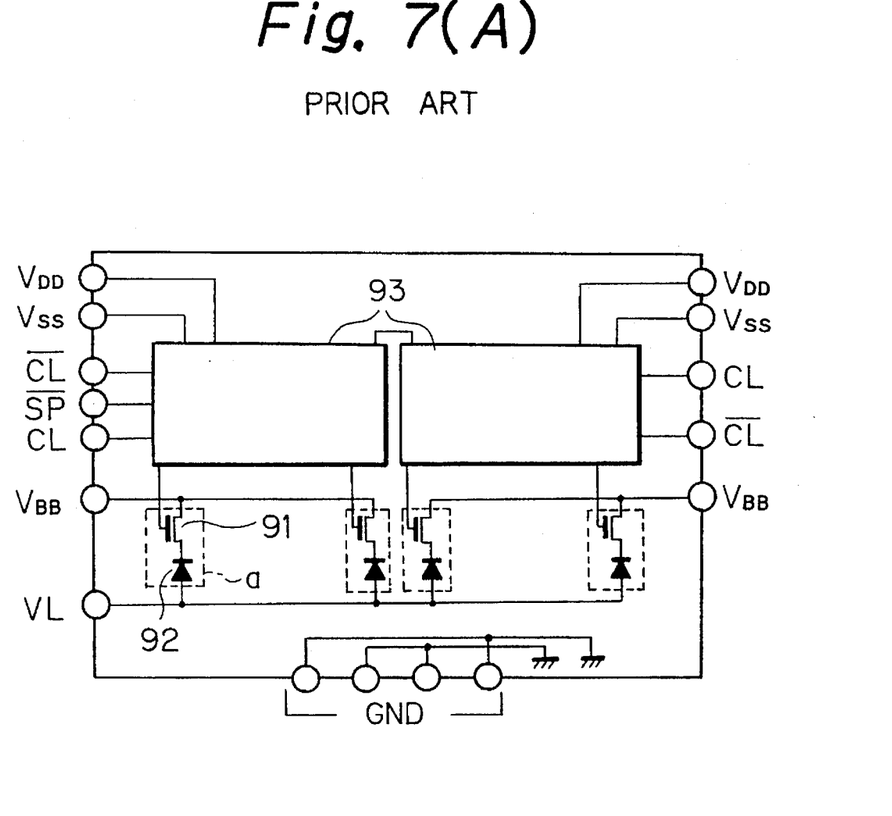
FIGS. 7(A) and 7(B) show a prior image sensor.
Figure 7B:
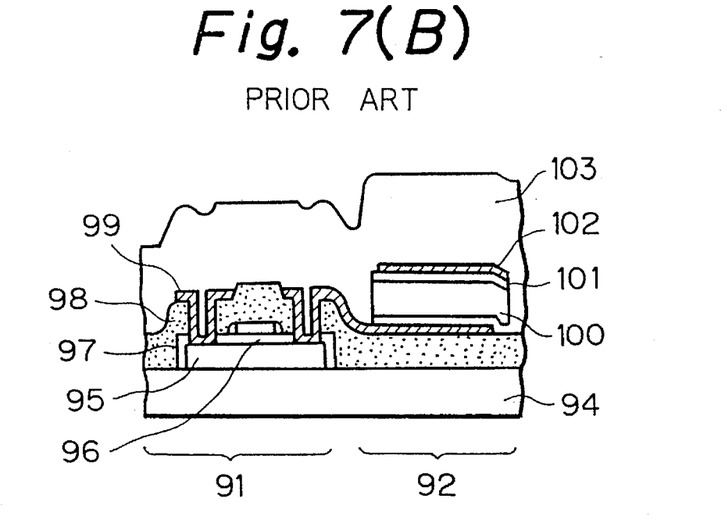

FIG. 7 shows a prior solid state image sensor. FIG. 7A is a circuit diagram of a sensor module, and FIG. 7B is an enlarged cross section of the portion enclosed by dotted line in FIG. 7A.

In FIG. 7A, the numeral 91 is a thin film transistor (TFT), 92 is a photo-diode, and 93 is a shift register, which is coupled with the photo-diode for operating the same. The symbols $V_{DD}$, $V_{SS}$, CL, $V_{BB}$, GND et al show terminals for input, output, and/or power supply.

As shown in FIG. 7B, the thin film transistor 91 and the photo-diode 92 are produced on a single substrate 94 made of quartz. The transistor 91 comprises a poly-silicon layer 95, a gate insulation film 96, and a gate electrode 97, and the photo-diode 92 comprises an amorphous silicon layer 100, an amorphous silicon layer 101 doped with boron, and ITO (indium tin oxide) layer 102. In FIG. 7B, 98 is an oxide layer, 99 is an electrode, and 103 is a passivation layer.

A prior image sensor has, separately, an image sensor portion made of a photo-diode 92, and a drive circuit portion made of a thin film transistor 91, and those portions are produced separately.

As for an image sensor, not only an photo-diode of FIG. 7, but also a photo-transistor using amorphous silicon, and/or a multi-chip type image sensor using single crystal silicon is possible.

However, a prior solid state image sensor shown in FIG. 7 has the disadvantage that an image sensor portion and a circuit portion for operating said image sensor portion are produced separately. Therefore, the producing steps must include the steps for producing an image sensor portion, the steps for producing the related circuit portion, and the steps for coupling those two portions. Therefore, the producing steps are complicated, and producing yield rate decreases, and the producing cost increases.

In addition, as a photo-diode for an image sensor has no function for amplification, a separate amplifier circuit must be attached.

Another prior image sensor, for instance, a photo-transistor using amorphous silicon has the disadvantage that optical response is slow, and it is not used for high speed facsimile system. It has further the problem for stability of layers, and operational reliability.

Another prior image sensor, like, multi-chip type image sensor using crystal silicon has the disadvantage that characteristics of each chip are not uniform, and therefore, an image sensor for intermediate darkness is difficult. In addition, the coupling between chips is difficult, and therefore, it is impossible to provide excellent picture. Further, it must have an selfoc lens when it is used as a contact type image sensor.

Further, in practical application of an image sensor for a facsimile which has a plurality of image sensors, the electrical characteristics of each image sensor are not uniform due to ununiformness of mobility and/or threshold voltage of each image sensor, and therefore, output potential of each image sensor relating to each dot of facsimile signal at dark condition is not uniform.

If dark output is not uniform, the measure of illumination is difficult, since dark output is reference output. Therefore, conventionally, dark output for each pixel is stored in a ROM (read only memory), and a bright output of an image sensor is compared with a dark output which is stored in the ROM, in order to determine whether it is dark or bright.

Therefore, conventionally, dark output of each pixel of a series of image sensors is measured and the measured value is stored in the ROM. Therefore, an image sensor for a facsimile system is very expensive.

SUMMARY OF THE INVENTION

It is an object, therefore, of the present invention to overcome the disadvantages and limitations of a prior semiconductor device by providing a new and improved semiconductor device.

It is also an object of the present invention to provide an image sensor in which plane operation is possible, having related transistor elements on the same substrate.

It is also an object of the present invention to provide an image sensor which is uniform in electrical characteristics.

It is still another object of the present invention to provide an image sensor which has a capacitor which stores reference charge at dark condition.

The above and other objects are attained by a method for producing a non single crystal semiconductor device comprising the steps of; placing amorphous silicon layer on a substrate through low pressure CVD process using disilane gas; effecting solid phase growth to said amorphous silicon layer by heating said substrate together with said layer in nitrogen gas atmosphere at temperature 500° C.–650° C. for 4–50 hours; producing an insulation layer on said solid phase growth layer by oxidizing surface of said solid phase growth layer at temperature 900° C.–1100° C. in atmosphere selected from dry atmosphere and wet atmosphere; implanting donor into said solid phase growth layer around said insulation layer for a source and a drain of a transistor; and placing a conductive layer on said insulation layer as a gate electrode.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
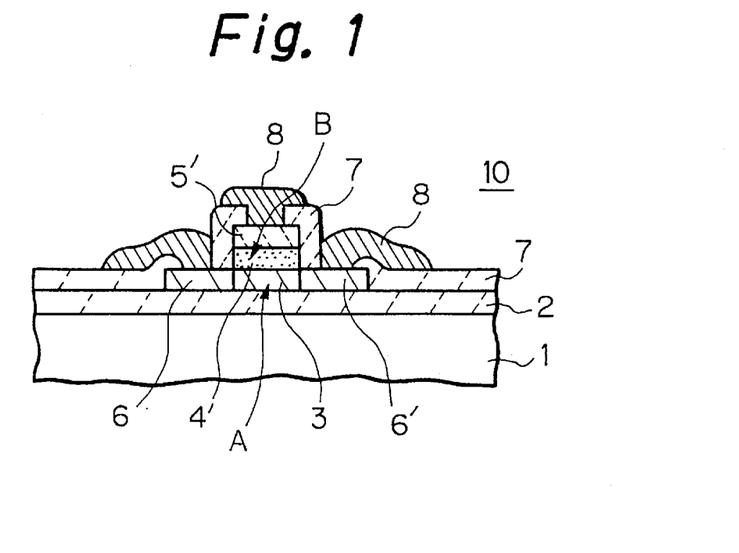
FIG. 1 shows cross sectional view of an image sensor according to the present invention.
Figure 2A:
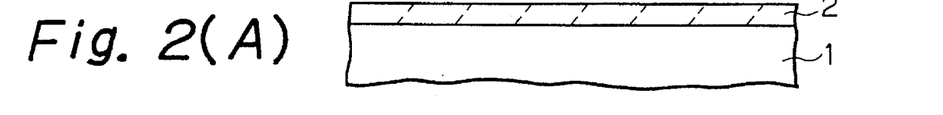
FIGS. 2(A), 2(B), 2(C), 2(D), 2(E), and 2(F) show producing steps of the image sensor of FIG. 1, FIGS. 3(A) and 3(B) show the continuation of the producing steps of the image sensor of FIG. 1, FIGS. 4(A) and 4(B) show characteristics curves of the image sensor according to the present invention.
Figure 2B:
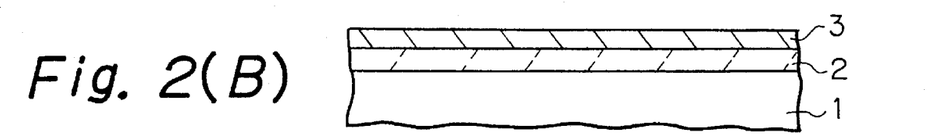
Figure 2C:
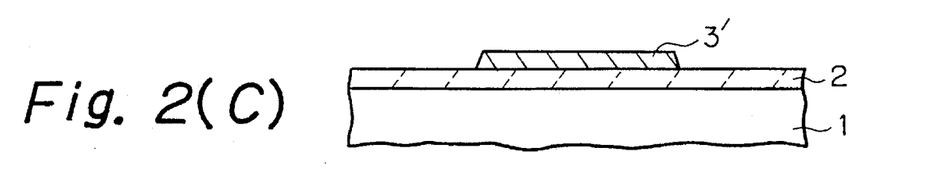
Figure 2D:
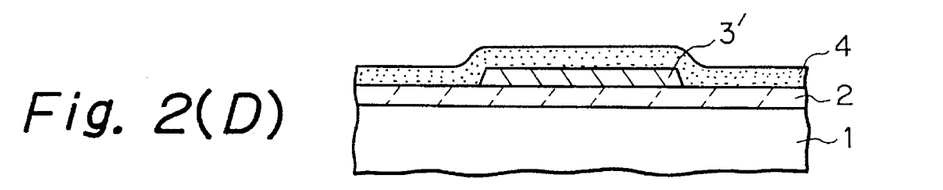
Figure 2E:
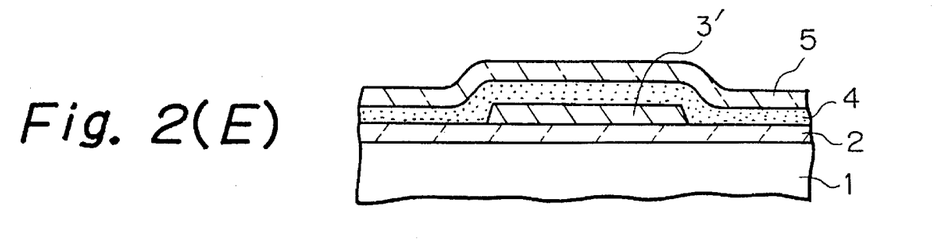
Figure 2F:
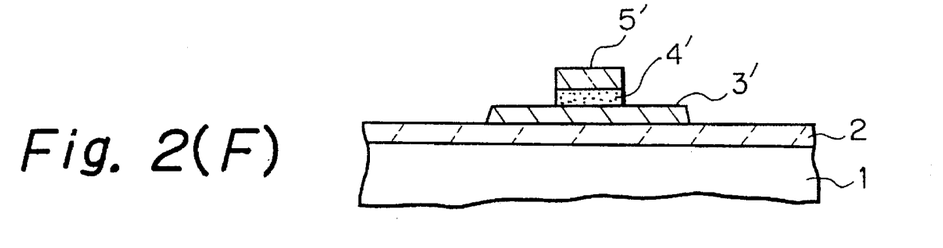
Figure 3A:
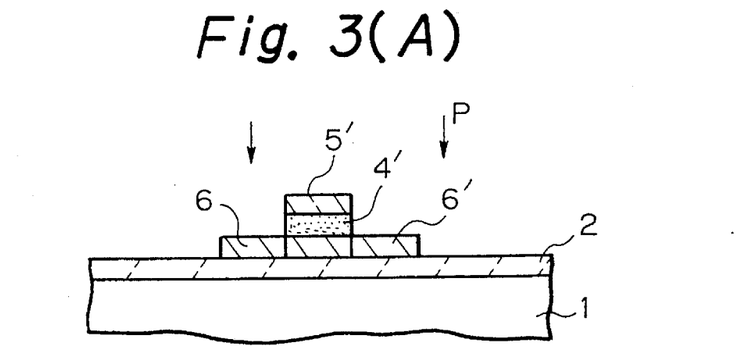
Figure 3B:
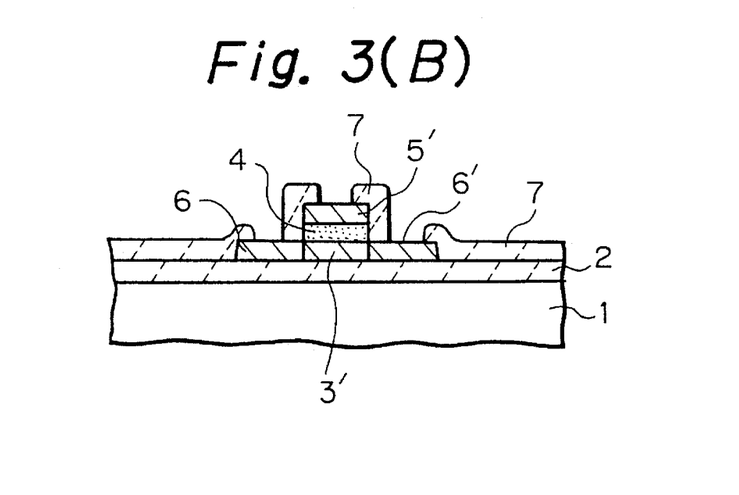

FIG. 1 is a cross section of the image sensor according to the present invention, and FIGS. 2 and 3 show the producing steps of the image sensor according to the present invention.

In FIG. 1, the numeral 1 is a substrate, 2 is an insulation layer made of $S_iO_2$, 3 is an active layer, 4' is a gate insulation layer, 5' is a gate electrode, 6 is a source region, 6' is a drain region, 7 is an insulation layer, 8 is an electrode, and 10 shows a whole view of an image sensor or a thin film transistor (TFT).

The producing steps of the image sensor of FIG. 1 is described in accordance with FIGS. 2 and 3.

(1) A substrate 1, for instance, a quartz substrate is placed, and an insulation layer 2 of $S_iO_2$ is deposited on the substrate 1 by the thickness 3000 Å through sputtering process (see FIG. 2A).

(2) An amorphous silicon layer 3 is produced on the insulation layer 2 by the thickness 500 Å–2000 Å through LPCVD process (Low Pressure Chemical Vapor Deposition)(see FIG. 2B), using disilane gas ($Si_2H_6$).

The process condition is as follows.

| $Si_2H_6$ gas | 100–500 SCCM (standard cubic centimeter per minute) |
| --- | --- |
| He gas | 500 SCCM |
| Pressure | 0.1 Torr |
| Temperature | 430–500° C. |

Preferably, the growth rate of the amorphous silicon layer is in the range between 50 Å/minute and 500 Å/minute. The value of the growth rate affects to the oxygen density is the layer. The preferable oxygen density is less than $2\times10^{19}/cm^3$ When the oxygen density is high, a large crystal does not grow in the following anneal process, or the solid state growth process. The important factor for providing that low oxygen density is the growth rate of the layer. The growth rate may be controlled by adjusting concentration of disilane gas, and flow rate of disilane gas.

(3) An anneal process is carried out for the amorphous layer 3 to provide non-single crystal silicon layer.

The anneal process crystallizes the amorphous silicon layer 3 produced through Low Pressure CVD process. In the embodiment, the anneal process is carried out through solid state growth in nitrogen ($N_2$) atmosphere.

The process condition of anneal process is as follows.

| $N_2$ | 1 SLM (standard liter per minute) |
| --- | --- |
| Temperature | 500–650° C. |
| Process time | 4–50, preferably 15 hours |

If temperature is lower than 500° C., no crystallization of an active layer is obtained. If the temperature is higher than 650° C., a crystal grain does not grow, and electrical characteristic is deteriorated. If the process time is shorter than 4 hours, anneal is insufficient, and if the process time is longer than 50 hours, the result is the same as that of 50 hours.

The atmosphere is not restricted to nitrogen gas, but helium gas (He) atmosphere is possible.

The size of crystal grains in the active layer in the above processes is in the range between 250 to 8000 Å.

(4) An island 3' is shaped by patterning the non-single crystal silicon layer which was annealed (see FIG. 2C).

(5) The whole surface of the substrate including said island 3' is thermally oxidized to produce a gate insulation layer 4 by the thickness 1000 Å (see FIG. 2D). The process condition for the gate insulation layer is as follows.

| $O_2$ gas | 2.7 SLM |
| --- | --- |
| Temperature | 900–1100° C. preferably 1000° C. |
| Process time | 150 minutes |

The thermal oxidation process around 1000° C. functions not only for producing a gate insulation layer 4, but also for supplement for the anneal process for the island 3'. The supplement of the anneal process at high temperature improves an active layer, and provides excellent electrical characteristics of an image sensor.

If the temperature is lower than 900 ° C., the quality of the active layer is deteriorated, and the withstand voltage of an image sensor is lowered. If the temperature is higher than 1100° C., a substrate of quartz is broken.

The oxidation may be either dry oxidation in dry atmosphere, or wet oxidation in water-vapor atmosphere.

(6) An amorphous layer 5 which functions as a gate electrode is produced on said gate insulation layer 4 through plasma CVD process (see FIG. 2E). The process condition for producing said amorphous layer 5 is as follows.

| $SiH_4$ gas | 10–50 SCCM |
| --- | --- |
| 5% $PH_3/H_2$ gas | 5–20 SCCM |
| Pressure | 0.1–0.5 Torr |
| Power | 50–500 watts |
| Temperature | 200–400° C. |

(7) The gate electrode layer 5 and the gate insulation layer 4 are patterned through etching process to provide a gate insulation layer 4' and the gate electrode 5' (see FIG. 2F).

(8) An impurity, which is phosphor (P) for an N-channel transistor, or boron (B) for a P-channel transistor, is doped through ion doping process into the crystallized non-single crystal silicon layer 3' with the mask by the gate insulation layer 4' in order to provide the source region 6 and the drain region 6'. The embodiment of FIG. 3A shows the case of the doping of phosphor (P).

(9) Next, the whole body is heated in nitrogen atmosphere ($N_2$) for five hours at 550° C. in order to activate dopant, and crystallization of amorphous silicon layer 5' for a gate electrode.

(10) Then, the hydrogenation process is carried out for the whole body at 400° C. for 30 minutes in hydrogen atmosphere, so that the trap density of semiconductor is decreased.

(11) An inter-layer insulation layer 7 of $S_iO_2$ is produced on the whole surface of the substrate by the thickness 4000 Å through TEOS process (Tetraethoxy Silane). The inter-layer insulation layer 7 provides insulation between semiconductor elements on the same substrate (for instance, an image sensor is insulated from other transistors). The process condition of the insulation layer 7 is as follows.

| TEOS gas | 10–50 SCCM |
|---|---|
| O₂ gas | 500 SCCM |
| Power | 50–300 watts |
| Temperature | 400° C. |

(12) The insulation layer 7 is patterned to provide a contact hole (see FIG. 3B).

(13) Finally, an aluminium layer for an electrode is attached and said layer is patterned to provide aluminium electrode 8, and an image sensor of FIG. 1 is completed.

In the above constitution, input light A illuminates light receiving region between a drain and a source on an active layer 3' through a transparent substrate as shown in FIG. 1.

When a gate electrode 5 is made of ITO (Indium Tin Oxide), instead of aluminium, input light may illuminate an active layer through the electrode 8 as shown by B in FIG. 1.

Figure 4A:
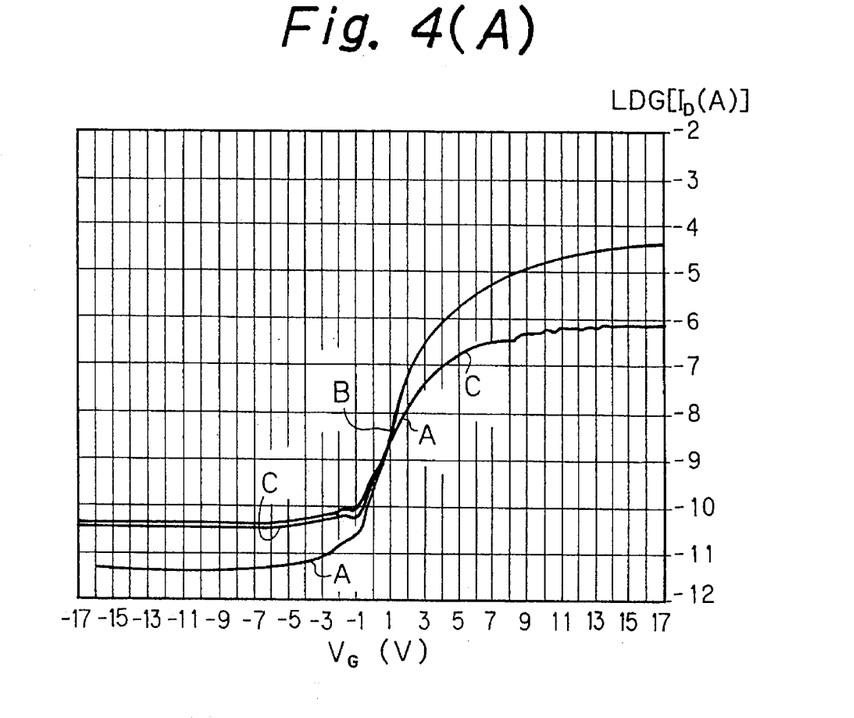
Figure 4B:
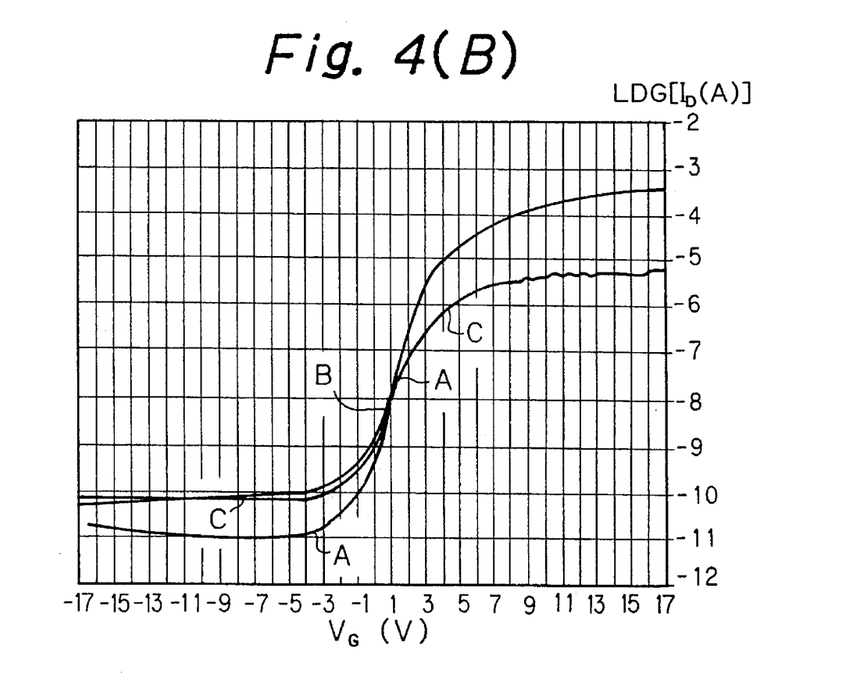

FIGS. 4A and 4B show characteristics curves of the relations between drain current ($I_D$) and gate voltage ($V_G$). The sample in those curves has the gate width (W) 180 μm, and the gate length (L) 20 μm. FIG. 4A shows the case that the voltage $V_D$ between the source and the drain is 0.1 V, and FIG. 4B shows the case that $V_D$ is 1.00 V. In those figures, the curve A shows the case that it is dark, and the curve B shows the case that it is bright. The curve C, which is the difference between the curves A and B, shows the light current. The vertical axis is indicated by logarithm scale, therefore, although it appears that the curve B coincides with the curve A when $V_G$ is high, the difference between the curves A and B exists as shown by the curve C.

As shown by the curves A, B and C in FIGS. 4A and 4B, the present image sensor has sensitivity for external light. As the curve A shows the case it is dark, and the curve B shows the case it is bright, the curve C which is the difference between the curves A and B shows the optical sensitivity.

It is quite clear that the drain current $I_D$ when it is bright is different from that when it is dark, and the difference shows the optical sensitivity.

Figure 5:
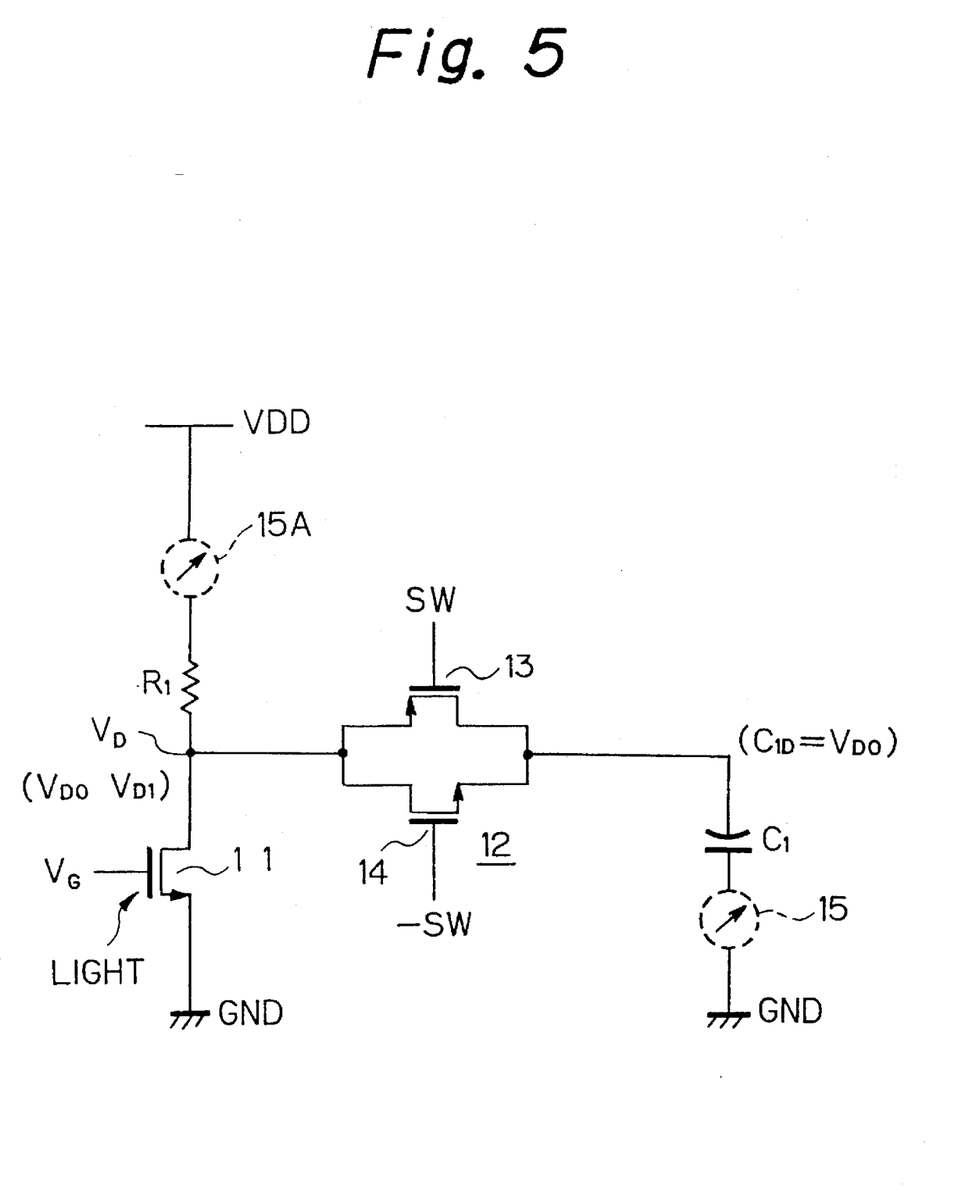
FIG. 5 shows a circuit diagram of the image sensor which stores dark potential according to the present invention.
Figure 6A:
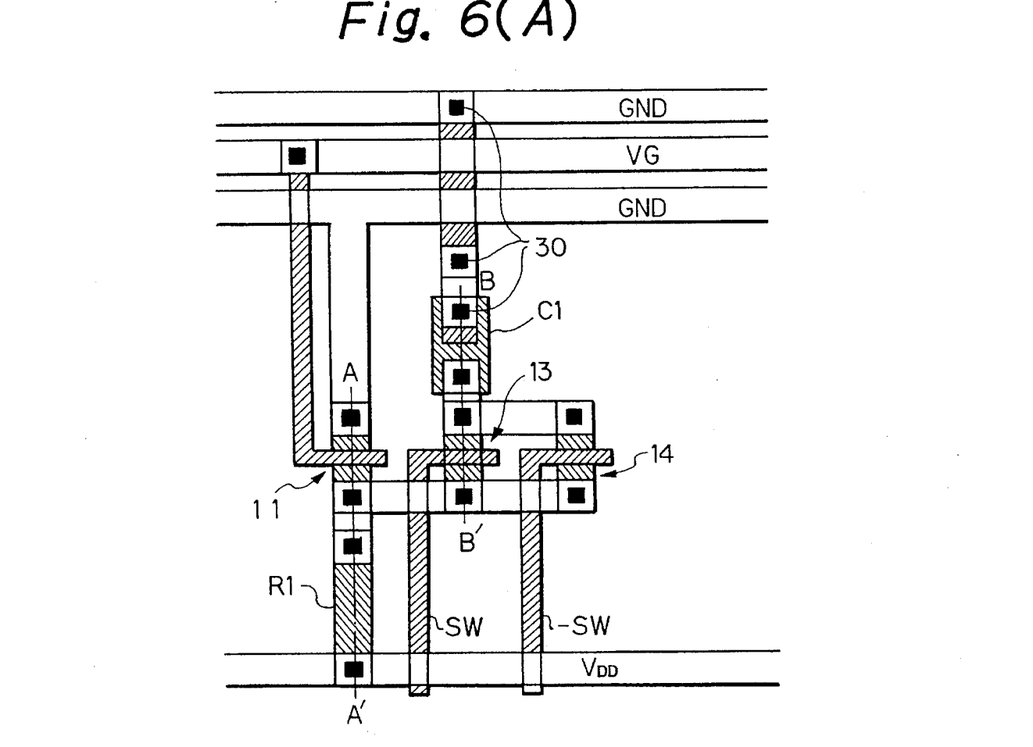
FIGS. 6(A), 6(B), and 6(C) show an IC pattern of the image sensor according to the present invention.
Figure 6B:
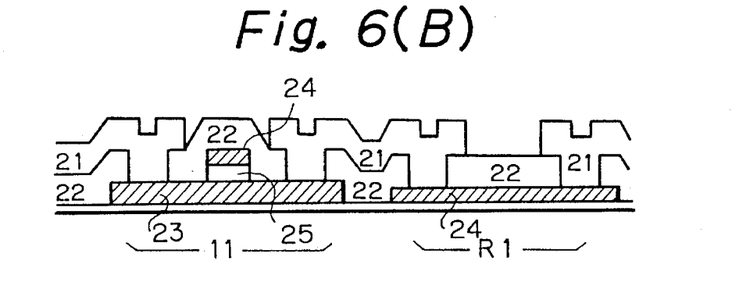
Figure 6C:
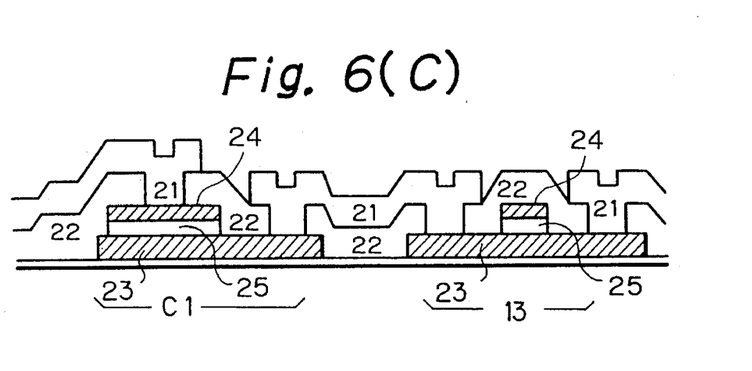

Next, the dark potential hold type image sensor according to the present invention is described in accordance with FIGS. 5 and 6. FIG. 5 shows a circuit diagram of said dark potential hold type image sensor, and FIG. 6 shows the IC pattern of semiconductor.

In FIG. 5, the numeral 11 is an image sensor as described in accordance with FIGS. 1 through 3, 12 is a switch having a P-channel thin film transistor 13 and an N-channel thin film transistor 14 coupled parallel with each other, $R_1$ is a resistor and $C_1$ is a capacitor. Those transistors 13 and 14 have MOS structure and are produced on the same substrate as that of the image sensor 11, together with the resistor $R_1$ and the capacitor $C_1$.

The operation of the circuit of FIG. 5 is described below.

(1) When it is dark, the switching signal SW is applied to the gate of the transistor 13, and the switching signal -SW is applied to the gate of the transistor 14, so that the switch 12 is switched to ON state, and the drain potential $V_D$ of the image sensor 11 is held in the capacitor $C_1$. In that case, it is assumed that the gate voltage $V_G$ is applied to the gate of the image sensor 11, and the current relating to gm.$V_G$ flows through the drain-source circuit of the image sensor, said current generates voltage drop across the resistor $R_1$. Thus, the potential $V_{D0}$ at the junction of the resistor $R_1$ and the image sensor 11 is held in the capacitor $C_1$. The value gm is determined by the ratio of the channel length and the channel width, mobility of semiconductor, gate voltage $V_G$, and the threshold voltage of the image sensor.

Then, the switch 12 is switched to OFF state.

(2) Next, when it is bright and the image sensor 11 is illuminated, the resistance between the drain and the source of the image sensor decreases, and more current than it is dark flows, and the potential $V_{D1}$ at the junction of the resistor $R_1$ and the image sensor 11 becomes lower than $V_{D0}$ which is held in the capacitor $C_1$. The potential $V_{D1}$ depends upon the illumination.

(3) Next, the switch 12 is switched to ON state. Then, the charge held in the capacitor $C_1$ flows or discharges through the switch 12 and the image sensor 11. The discharge current is measured by the current meter 15 which is in series with the capacitor $C_1$. The discharge current continues until the potential across the capacitor $C_1$ reaches $V_{D1}$. The total of the discharge depends upon the illumination or the intensity of the image sensor 11. Thus, the illumination is measured.

By the way, as an image sensor 11 has constant current characteristics, the illumination may be measured by a current meter 15A which is inserted between the power source $V_{DD}$ and the resistor $R_1$. When the capacitor $C_1$ discharges, the power supply does not supply current, and as the discharge decreases, the current from the power supply increases. Therefore, the measure of the current in the power supply may provide the illumination.

As the discharge depends upon the difference between $V_{D0}$ and $V_{D1}$, the illumination is measured by $V_{D0}$ and $V_{D1}$.

The capacitor $C_1$ may remove a ROM which has been used for storing dark potential as reference potential in a prior image sensor.

According to the present invention, dark output $V_{D0}$ of an image sensor is held in a capacitor $C_1$, and it is determined whether it is dark or bright by comparing bright output $V_{D1}$ with dark output $V_{D0}$ which is stored in the capacitor. The capacitor $C_1$ is produced on the same substrate as that of the image sensor itself through thin film technique.

When not only dark/bright output, but also half tone output or multilevel output is desired, a plurality reference potentials (0 through $V_{10}$) are stored in the capacitors $C_0$ through $C_{10}$, and it is determined between which adjacent reference potentials the drain potential $V_{D1}$ falls. When an output is binary, $V_{D1}$ is compared with the highest reference potential $V_{10}$, and when an output is multilevel, $V_{D1}$ is compared with each of the reference potentials.

FIG. 6 shows an embodiment of an IC pattern of an image sensor of FIG. 5. FIG. 6A is the plane view of the whole pattern, FIG. 6B is the cross section along A–A' of FIG. 6A, and FIG. 6C is the cross section along B–B' of FIG. 6A. The symbol $V_{DD}$ is the power source circuit, the symbol GND is the ground circuit, and $V_G$ is the gate potential circuit. An image sensor 11 and a resistor $R_1$ exist along the line A–A', a capacitor $C_1$ and a MOS transistor 13 exist along the line B–B'. A black rectangle 30 shows an electrode of each element for connection with another element.

In FIG. 6, the image sensor 11 has an active layer 23, a gate insulation layer 25, a gate electrode layer 24, an inter-layer insulation layer 22, and wiring layer 21 of aluminium (see FIG. 6B). The resistor $R_1$ is produced when the gate electrode layer 24 is deposited, alternatively, it may be produced when the source and the drain are deposited.

The capacitor $C_1$ is produced by the active layer 23, the gate insulation layer 25 and the gate electrode layer 24, when those layers for the image sensor are produced. The capacitance is provided between the conductive layers 23 and 24 through the insulation layer 25. Alternatively, the capacitance may be provided by using an inter-layer insulation layer 22 which is sandwiched by a pair of conductive layers.

The switching transistor 13 is comprised of the active layer 23, the gate insulation layer 25, the gate electrode layer 24, the inter-layer insulation layer 22 and the wiring layer 21, and is produced at the extension of the capacitor $C_1$. Another switching transistor 14 is produced adjacent to the transistor 13 as shown in FIG. 6A.

It should be noted of course that the capacitor $C_1$, the resistor $R_1$, and a pair of transistors 13 and 14 are produced on the common substrate at the same time as the image sensor 11 is produced.

As mentioned above in detail, an active layer of the present image sensor is produced by using disilane ($Si_2H_6$) through Low Pressure CVD process to provide amorphous silicon layer, which is annealed. A gate insulation layer is produced through oxidation of surface of an active layer. Said oxidation at high temperature improves the anneal of the active layer. Therefore, an image sensor which is arranged on a plane is obtained with high productivity.

Further, a dark output hold type image sensor according to the present invention removes a ROM which keeps dark potential in a prior art. The use of a capacitor in the present invention permits more non-uniformity in of electrical characteristics of image sensors, and provides reduction in the cost of producing an image sensor.

From the foregoing it will now be apparent that a new and improved image sensor has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. A method for producing a non single crystal semiconductor device comprising the steps of;

placing an amorphous silicon layer on a substrate through low pressure CVD process using disilane gas, effecting solid phase growth to said amorphous silicon layer to obtain an active layer by heating said substrate together with said layer at temperature in the range 500° C.–650° C. for 4–50 hours, producing an insulation layer on said solid phase growth layer by oxidizing the surface of said solid phase growth layer at a temperature in the range 900° C.–1100° C. in an atmosphere selected from dry atmosphere and wet atmosphere, implanting donor impurities into said solid phase growth layer around said insulation layer to form a source and a drain of a transistor, and placing a conductive layer on said insulation layer as a gate electrode, and further comprising depositing a capacitor, a resistor and a switching transistor on said substrate, including the steps of;

depositing a resistor layer together with a conductive wiring layer coupled with said resistor layer, said resistor layer being provided at the same time as said conductive layer on said insulation layer as a gate electrode.

depositing a capacitor having a dielectric layer sandwiched by a pair of conductive layers, said dielectric layer being provided at the same time as said insulation layer, and said pair of conductive layers being provided at the same time as said active layer and said conductive layer on said insulation layer as a gate electrode, and depositing at least one transistor of MOS structure having an active layer, a gate insulation layer, and a gate electrode, said deposition of said transistor being performed at the same time as said non single crystal semiconductor device.

2. A method according to claim 1, wherein growth rate of said amorphous silicon layer is in the range between 50 Å/minute and 500 Å/minute.

3. The method as defined by claim 1, wherein said solid phase growth of said amorphous layer is performed by heating in a nitrogen atmosphere.

4. A method for producing a non single crystal semiconductor device according to claim 1, further comprising the step of performing a hydrogenation on at least said silicon layer in a hydrogen atmosphere.

5. A method according to claim 4, wherein said hydrogenation is carried out at 400° C. for about 30 minutes.

6. A method for producing a non single crystal semiconductor device according to claim 2, further comprising the step of performing a hydrogenation on at least said silicon layer in a hydrogen atmosphere.

7. A method according to claim 6, wherein said hydrogenation is carried out at about 400° C. for about 30 minutes.

* * * * *